United States Patent [19]

Schade, Jr.

[11] 4,201,947
[45] May 6, 1980

[54] LONG-TAILED-PAIR CONNECTIONS OF MOSFET'S OPERATED IN SUB-THRESHOLD REGION

[75] Inventor: Otto H. Schade, Jr., North Caldwell, N.J.

[73] Assignee: RCA Corporation, New York, N.Y.

[21] Appl. No.: 876,634

[22] Filed: Feb. 10, 1978

[51] Int. Cl.² .......................... H03F 3/45; H03F 3/16; H03K 5/20
[52] U.S. Cl. ................................... 330/253; 307/304; 307/362; 330/261
[58] Field of Search ....................... 307/362, 363, 304; 330/253, 261, 277

[56] References Cited

U.S. PATENT DOCUMENTS

| | | | |
|---|---|---|---|
| 3,852,679 | 12/1974 | Schade, Jr. | 330/253 X |
| 3,956,708 | 5/1976 | Musa | 330/253 |
| 4,048,575 | 9/1977 | Musa | 330/253 |
| 4,050,030 | 9/1977 | Russell | 330/253 X |
| 4,060,770 | 11/1977 | Schade, Jr. | 330/253 |

OTHER PUBLICATIONS

Stafford et al., *IEEE Journal of Solid-State Circuits*, vol. -SC-9, No. 6, pp. 381-387; Dec. 1974.
Gosney, *IEEE Transactions on Electron Devices*, vol. ED-19, No. 2, pp. 213-219, Feb. 1972.
Troutman, *IEEE Journal of Solid-State Circuits*, Vol. -SC-9, No. 2, pp. 55-60; Apr. 1974.
Vittoz et al., *IEEE Journal of Solid-State Circuits*, vol. -SC-12, No. 3, pp. 224-231; Jun. 1977.

*Primary Examiner*—Larry N. Anagnos
*Attorney, Agent, or Firm*—Eugene M. Whitacre; Paul J. Rasmussen; Allen LeRoy Limberg

[57] ABSTRACT

Long-tailed pair connections of MOSFET's are used as voltage comparators, the input stages of operational amplifiers, and other circuitry where their nearly infinite gate impedances can reduce the loading upon preceding circuitry. As conventionally operated, the tail current caused to flow through the interconnected source electrodes of the MOSFET's is sufficient to bias them such that their source-to-gate voltages exceed a threshold voltage, and the input voltage offset error of the long-tailed MOSFET pair is likely to be higher than that of most long-tailed bipolar transistor pairs. By selecting a tail current that is sufficiently small to operate a long-tailed MOSFET pair such that their source-to-gate voltages are in the sub-threshold region, the MOSFET's exhibit exponential drain current versus source-to-gate characteristics which result in markedly reduced input offset voltage error.

3 Claims, 7 Drawing Figures

LONG-TAILED-PAIR CONNECTIONS OF MOSFET'S OPERATED IN SUB-THRESHOLD REGION

The present invention relates to the operation of long-tailed MOSFET pairs to reduce their input offset voltage error.

A long-tailed pair configuration of MOSFET's is characterized by the two FET's having respective source electrodes connected together and to a source of quiescent current termed "tail current", having respective gate electrodes to which respective input potentials are applied, and having respective drain electrodes from which currents are available that sum to equal the tail current and exhibit balanced current variations responsive to the difference between the input potentials. The input impedances exhibited at the gate electrodes of the MOSFET's are extremely high—e.g., many megohms—leading to the popularity of such configurations in voltage comparators and in the input stages of operational amplifiers.

"Input offset potential error" is a term used to identify the voltage which must be applied between the gate electrodes of the FET's in order that they apportion the tail current between them so that their drain currents can be subtractively combined to obtain a zero-valued error signal current. Conventionally, long-tailed pairs using MOSFET's are likely to exhibit rather high input offset potential errors. Half the yield of usable long-tailed MOSFET pairs in integrated circuitry employing them have undesirably tended to exhibit input offset potential errors of 20, 60 or even 100 millivolts as compared to errors in the 2 to 3 millivolt range for long-tailed bipolar-transistor pairs. By highly interdigitating the MOSFET's in the long-tailed pair, and by using protective circuits to prevent large source-to-gate potentials on either of the MOSFET's in the long-tailed pair to avoid stressing the insulation between their gate electrodes and their channels and so altering the transconductances of the MOSFET's, the present inventor had prior to the present invention been able to reduce the input offset potential errors so they did not exceed 8 to 10 millivolts on half of the usable yield. This tendency toward high input potential offset errors has forced one to carefully select pairs of FET's for critical applications and has resulted in low yield for such applications.

The present inventor has found that this tendency toward large input offset error is concomitant to the standard practice of biasing the MOSFET's in the long-tailed pair such that their quiescent source-to-gate voltages exceed the so-called threshold voltage above which square-law drain current versus source-to-gate potential characteristics obtain because of the MOSFET's channels being defined, as usual, by the strong inversion characteristics. As known, reducing the source-to-gate voltage, or $V_{GS}$, of a MOSFET below this threshold voltage results in exponential decrease in channel current.

This sub-threshold region of operation in which the MOSFET operates with a weakly inverted channel has been studied by other workers in the field. These studies have been directed for the most part towards the reduction of drain currents associated with such operation so that the MOSFET can be turned off more readily in digital applications, resulting in improved memories, etc. E. Vittoz and J. Fellrath, however, in their article "CMOS Analog Integrated Circuits Based on Weak Inversion Operation" appearing on pp. 224–231 of *IEEE Journal of Solid State Circuits*, Vol. SC-12, No. 3, June 1977, describe for the first time, insofar as the present invention is aware, the use of MOSFET's in the sub-threshold region for analog circuits. They point out that weak inversion operation is limited to low-speed circuits, because of the reduced channel conductance for given device dimensions as compared with strong inversion operation.

In the field of interfacing to transducers converting light, heat, acoustic energy, etc. to electric signals there is, however, room for voltage comparators and linear amplifiers that operate at very slow rates. Oftentimes, there is a requirement on electrical circuits having an initial stage with a long-tailed MOSFET-pair that they consume very little power and that their input potential error be small. This observation of the present inventor suggested to him that compromising speed in order to gain other favorable operating characteristics could make available new types of MOSFET circuitry suitable for applications where conventional MOSFET circuitry is inappropriate.

The present invention is embodied in a long-tailed-pair connection of MOSFET's in which the tail current is chosen lower than conventional practice to operate them in the subthreshold region. The resulting exponential drain current versus source-to-gate voltage ($I_{DS}$ vs. $V_{GS}$) characteristics are, of course, exponential. This leads to a relatively high transconductance ($g_m$) to $I_{DS}$ ratio in the MOSFET's as compared to conventional operation of MOSFET's, the value of $g_m$ being about 25 millimhos per milliampere and almost as great as the 40 millimhos per milliampere value for bipolar transistors.

Now, one would naturally expect the input offset errors associated with subthreshold operation of MOSFET's to be substantially worse than those associated with conventional operation of FET's and with bipolar transistors. This, inasmuch as one is dealing with a portion of the MOSFET operating characteristics normally regarded as being undesirable and being attributable to unknown and uncontrolled imperfections in the device structure. Most particularly, one would anticipate surface leakage problems to tend to cause increased input offset potential errors. Perhaps because of this natural expectation the subthreshold transconductance operation of MOSFET's has never been characterized for comparison.

Surprisingly, the present inventor has found that, contrary to this natural expectation, a fairly large range of tail currents (3–5 orders of magnitude) below threshold operation exists in which the input offset potential errors are reduced substantially below those associated with conventional above-threshold biasing. Half the yield of usable long-tailed-pair MOSFET's will exhibit input offset potential errors of only 2 millivolts or less. The present inventor has found that it is only at current levels well below that associated with threshold voltage that surface leakage problems cause modern FET's to exhibit a tendency toward higher input offset potential error.

In the drawing:

FIG. 1 is a schematic diagram, partially in block form, of a long-tailed-pair connection of MOSFET transistors arranged in accordance with the present invention to receive a tail current biasing them for operation in the subthreshold region;

FIG. 2 is the standard source-to-drain current ($I_{DS}$)—i.e., drain current—versus source-to-drain voltage ($V_{DS}$) as a function of source-to-gate-voltage ($V_{GS}$) characteristics of an enhancement-mode p-channel MOSFET used in relating the subthreshold operating region, where weak inversion characteristics prevail, to the regions of conventional operation, where strong inversion characteristics prevail;

Figure 1:
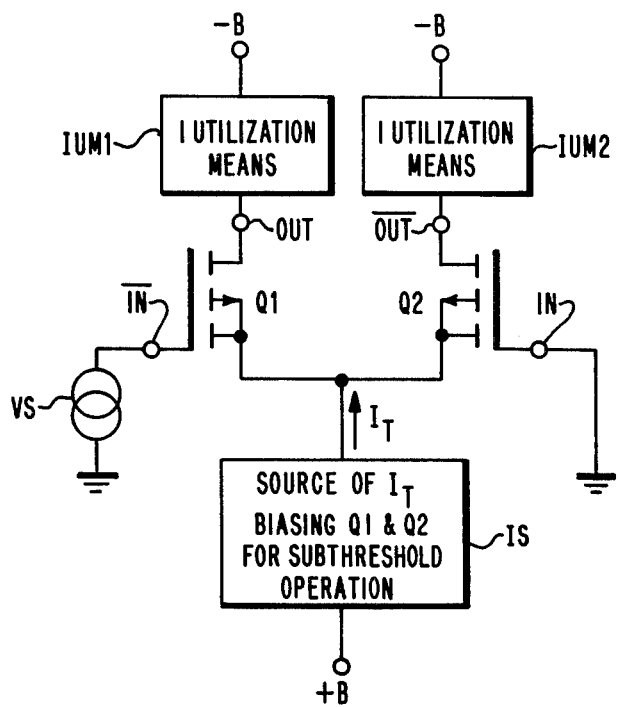

In FIG. 1 p-channel enhancement-mode MOSFET's Q1 and Q2 are connected in long-tailed pair configuration to receive a tail current $I_T$ at the interconnection of their source electrodes from a current source IS. The gate electrodes of Q1 and Q2 are at inverting and non-inverting input terminals IN and $\overline{IN}$, respectively, of the long-tailed-pair configuration. The drain electrodes of Q1 and Q2 are at non-inverting and inverting output terminals OUT and $\overline{OUT}$, respectively of the long-tailed pair configuration.

As shown, the IN and $\overline{IN}$ terminals may be referenced to the same quiescent potential and an input signal may be applied to one of them from a voltage source VS. The OUT and $\overline{OUT}$ terminals are connected to a relatively negative operating potential conditioning Q1 and Q2 for non-inverted operation via current utilization means IUM1 and IUM2, respectively. IUM1 and IUM2 might simply comprise resistive drain loads, for example, but in integrated circuit designs they often comprise a current mirror amplifier used as a balanced-to-single-ended signal converter and the input circuit of an ensuing amplifier stage. In short, the connections of the IN, $\overline{IN}$, OUT and $\overline{OUT}$ terminals can be made in accordance with prior art practice.

The distinguishing feature of the FIG. 1 embodiment of the invention as compared to prior-art long-tailed MOSFET pair configurations is that source $I_S$ is designed to provide for flow of tail current $I_T$ that is of smaller magnitude than that used in the prior art for MOSFET's of comparable channel dimensions to Q1 and Q2, resulting in Q1 and Q2 being biased for subthreshold operation. That is, though the design of the current source $I_S$ per se need not depart markedly from conventional practice, the combination of the long tailed pair with a current source $I_S$ providing a tail current $I_T$ far too small for conventional design purposes develops a new synergism wherein MOSFET's Q1 and Q2 are operated in the subthreshold region, substantially modifying their operating characteristics from those they would exhibit were they operated with strongly inverted channels. Classically, the tail current source is provided by a comparatively large-resistance resistor connecting the tail connection of Q1 and Q2 to a remote supply voltage; in such case reduction of the tail current $I_T$ would be achieved by increasing the resistance of this resistor. Usually, though, one wishes to avoid the need for providing a remote supply voltage and to avoid the integration of resistors with resistances more than a few tens of kilohms. So, conventionally, the tail current source for a long tailed pair is provided by the principal current conduction path of a further, tail-supply transistor biased for operation as a constant current generator. Often this transistor is a voltage-to-current converting device in current mirror amplifier combination with another transistor which is provided with feedback for conditioning it to function as a current-to-voltage converting device; the input current to the current mirror amplifier can be determined by a resistor to the supply voltage for the long tailed pair. A variety of schemes exist in the prior art for reducing the constant current flow through the tail-supply transistor—e.g. the use of emitter or source degeneration resistance, or the use of collector or drain current splitting.

Outside a laboratory environment one is advised to provide protection circuitry to assure that the dielectric coating between the gate electrode of each of transistors Q1 and Q2 and the channel induced in the semiconductor region between its source and drain regions is not subjected to potential stresses that lead to dielectric damage. Such damage tends to change the $I_{DS}$ vs. $V_{GS}$ characteristics of the transistors Q1 and Q2 respective to each other, and this undesirably increases the input offset potential error of the long-tailed FET pair. At the same time, the protection circuitry must be of a sort that does not apply leakage currents to the gate electrodes of the FET's since this will adversely affect input offset potential error if either of the gate electrodes is driven from a high impedance source. Appropriate gate protection circuitry is described in my co-pending U.S. patent application Ser. No. 837,280 filed Sept. 27, 1977, now U.S. Pat. No. 4,126,830, entitled "LOW LEAKAGE GATE PROTECTION CIRCUIT," and assigned like the present application to RCA Corporation.

Figure 2:
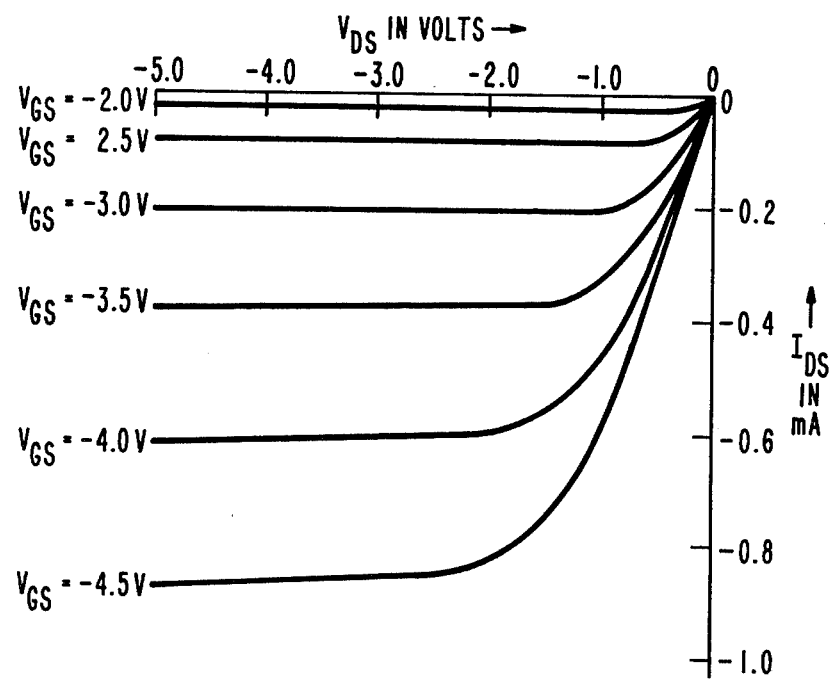

FIG. 2 shows the drain current versus source-to-drain voltage ($I_{DS}$ vs. $V_{DS}$) characteristics of an enhancement-mode p-channel MOSFET as a function of various source-to-gate voltages ($V_{GS's}$) plotted on linear scale. This characteristic may be viewed as a side view of successive sections in $V_{GS}$ of a three-dimensional solid.

Viewing sections through this three dimensional solid, which are perpendicular to the $V_{DS}$ axis, one obtains $I_{DS}$ vs $V_{GS}$ characteristics for various constant $V_{DS's}$. These curves will resemble each other in the so-called saturation region where the characteristics resemble the plate current versus cathode-to-grid voltage of a pentode, mirrored about the cathode-to-plate voltage axis.

Figure 3:
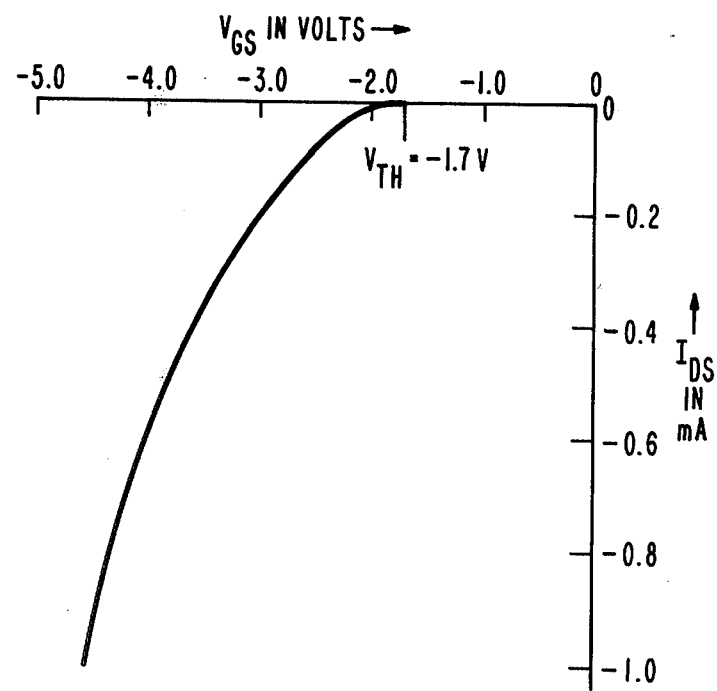
FIGS. 3 and 4 are plots of the transconductance ($g_m$) characteristics of an enhancement-mode p-channel MOSFET.

FIG. 3 shows such a $I_{DS}$ vs $V_{GS}$ curve for constant $V_{DS}$. Such operation can, for example, be noted in the FET's Q1 and Q2 if IUM1 and IUM2 comprise (a) a current mirror amplifier used as balanced-to-single-ended signal converter and (b) an ensuing amplifier stage conditioned by degenerative voltage feedback to exhibit substantially constant input voltage. The slope of this curve is the reciprocal of the transconductance or $g_m$, of the FET. This curve has the substantially square law characteristic down to its threshold voltage $V_{TH}$ associated with the conventional mode of operation with the strongly inverted channel.

For a channel width-to-length (W/L) ratio of 100, $V_{TH}$ is, for example, commonly quoted to be 1.7 volts in the standard BiMOS process used by RCA Corporation for fabricating MOS and bipolar transistors within the same integrated circuit. The characteristics in FIGS. 2 and 3 are those of such a transistor. The channel current is not zero for the threshold voltage $V_{TH}$ at which channel current exhibits substantial departure from square law characteristics, however. Rather, it is a small perhaps 20 microamperes of current commonly designated as "leakage current", thereby being ascribed by implication to imperfections in the surface of the insulated layer underlying the gate electrode and overlying the semiconductor region in which the channel is induced.

Figure 4:
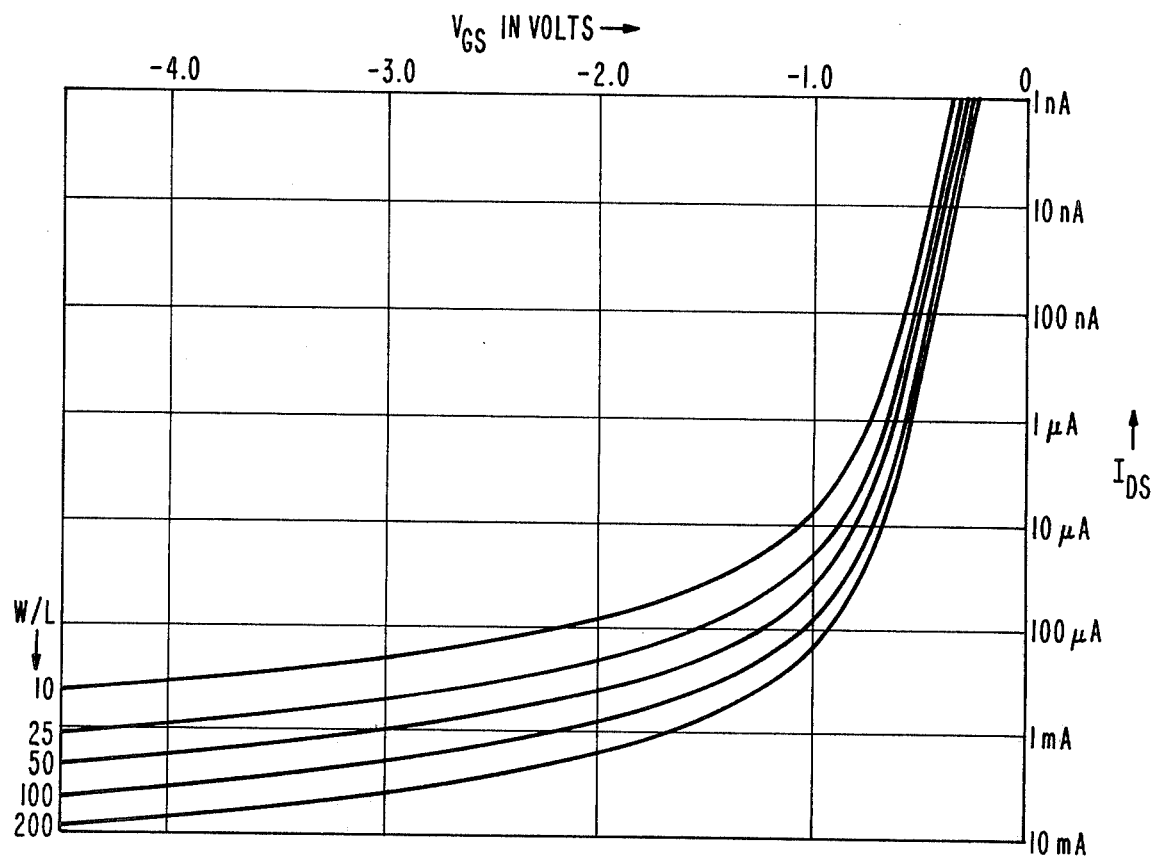

FIG. 4 shows a family of $I_{DS}$ vs $V_{GS}$ curves for MOSFET's with various W/L ratios in which the $I_{DS}$ vs $V_{GS}$ curve is plotted with $I_{DS}$ on a logarithmic rather than linear scale. This form of plotting de-emphasizes the high drain current portions of the characteristics and emphasizes their low drain current portions, respectively, making it easier to observe the existence of usable $I_{DS}$ vs $V_{GS}$ characteristics for $V_{GS} < V_{TH}$. The linearity of the $I_{DS}$ vs $V_{GS}$ characteristics for $V_{GS} < V_{TH}$ for a plot linear in $V_{GS}$ and logarithmic in $I_{DS}$ is evidence of the exponential $I_{DS}$ vs $V_{GS}$ characteristics which have been indicated to obtain in the subthreshold region.

Figure 5:
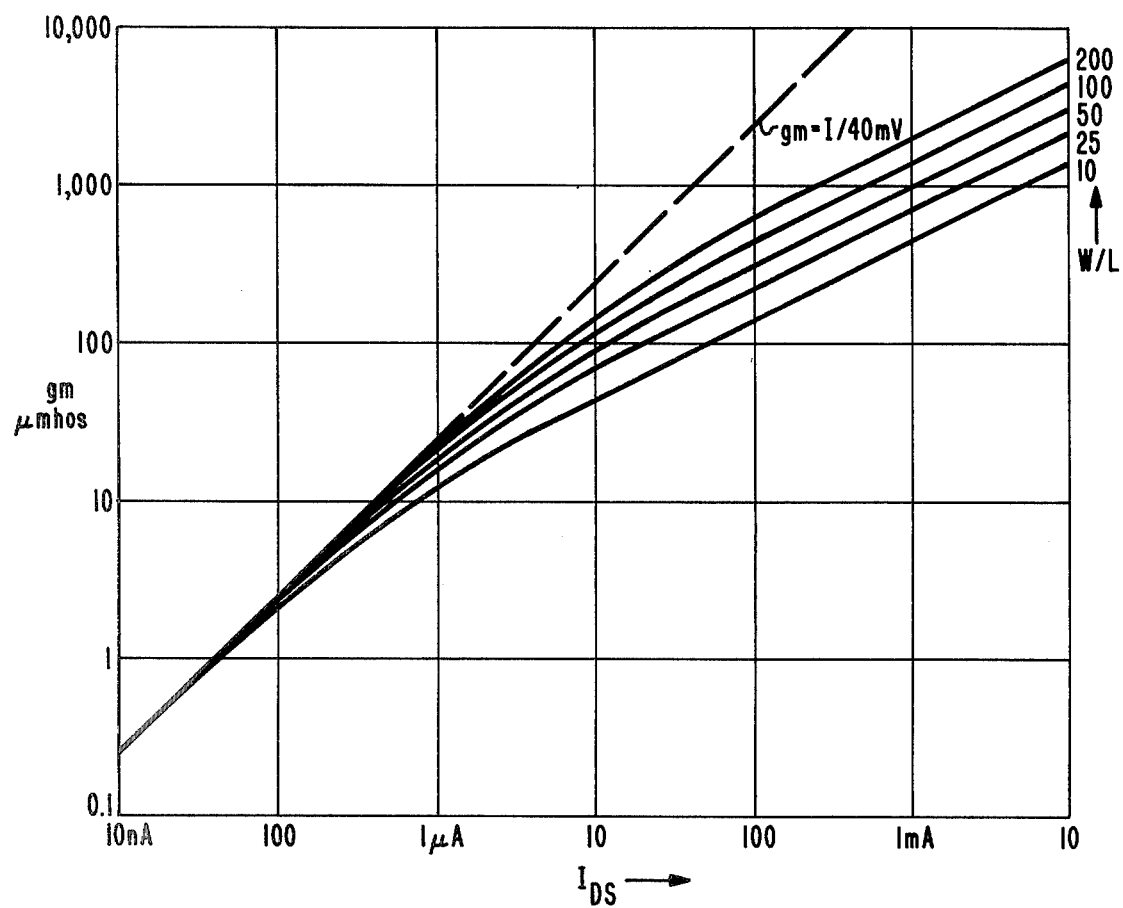
FIG. 5 is a plot of the $g_m$ characteristics of an enhancement-mode p-channel MOSFET versus $I_{DS}$.

FIG. 5 shows the reciprocal slope of the FIG. 4 curve—that is, the $g_m$ of the MOSFET,—plotted against its drain, or channel, current. At lower levels of channel current, the $g_m$ of the MOSFET is reduced, with the rate of reduction increasing in the subthreshold region to a value of 25 millimhos per milliampere. A higher rate of $g_m$ reduction for given channel current reduction, means the change in $V_{GS}$ required to cause a given percentage in channel current is reduced. This can be seen by remembering $g_m = (\partial I_{OUT}/\partial V_{IN})$. Rearranging, in any transistor: $\partial V_{IN} = (\partial IN_{OUT}/I_{OUT})/$(rate of conductance change in millimhos per millampere). So, in a long-tailed pair connection of MOSFET's, the difference in their $V_{GS}$'s required to correct an imbalance in their channel currents is reduced when the rate of $g_m$ reduction for given channel current reduction is increased.

In long-tailed bipolar transistor pairs, by contrast, the rate of $g_m$ reduction is a nearly constant 39 millimhos per milliampere for all current levels below those in which base current spreading phenomena take place. Reduction of collector (or emitter) current levels in such a long-tailed pair, of the sort which has been commonly used to the present time in integrated-circuit operational amplifiers and voltage comparators, does not provide a concomitant reduction in input offset potential error.

Figure 6:
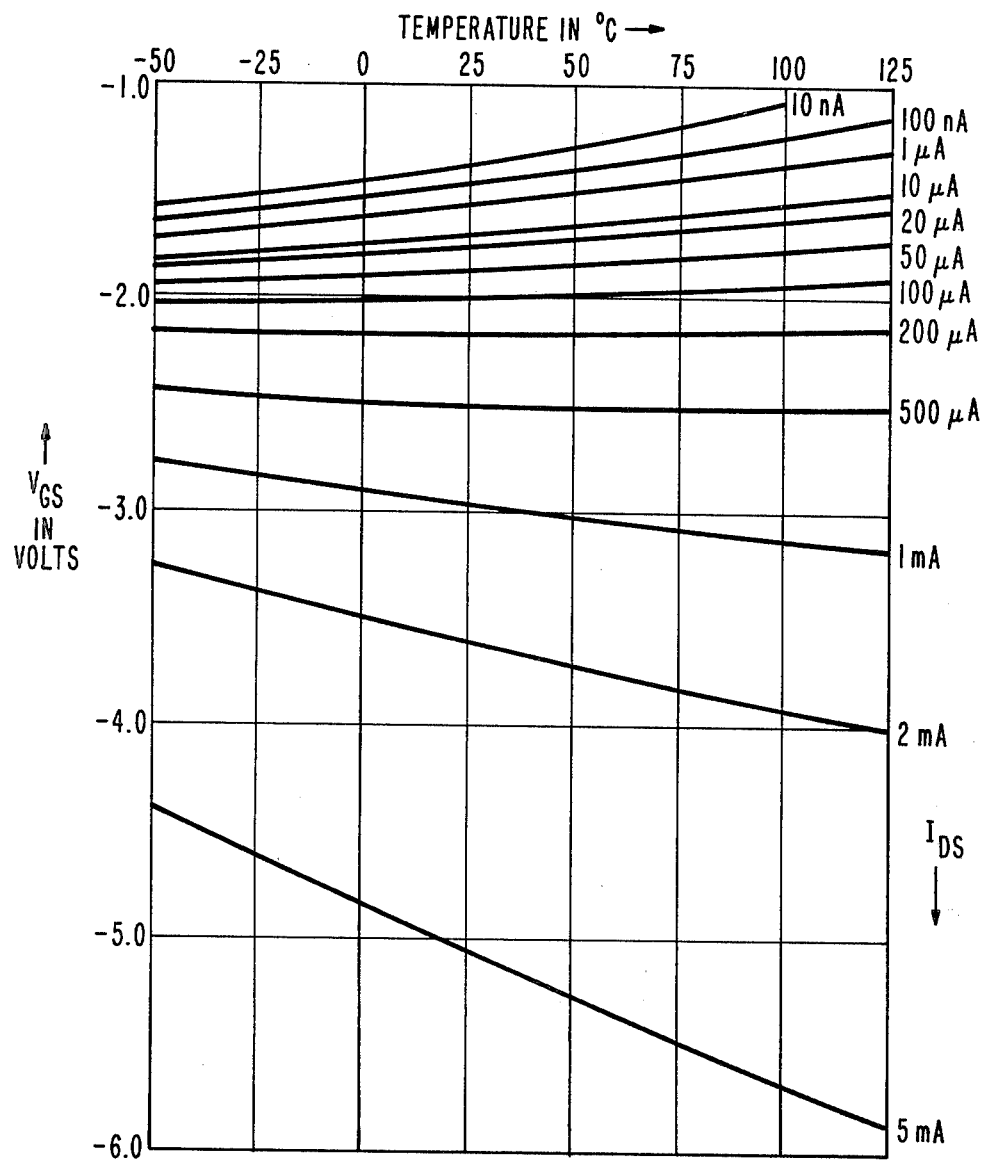
FIG. 6 is a plot of the temperature dependence of the $V_{GS}$ of an enhancement-mode p-channel MOSFET as a function of $I_{DS}$.

FIG. 6 shows the $V_{GS}$ versus temperature characteristics of a MOSFET having a W/L ratio of 100 operated at a $V_{DS}$ of 10 volts. The MOSFET's in the long-tailed pair normally have interdigitated structures, so that their temperatures may be expected to be within one degree Celsius of each other. Therefore, the effects of temperature upon the input offset potential error of the long-tailed FET pair may be expected to be distinctly second order, so long as steep thermal gradients on the integrated circuit are avoided in accordance with conventional practice.

Figure 7:
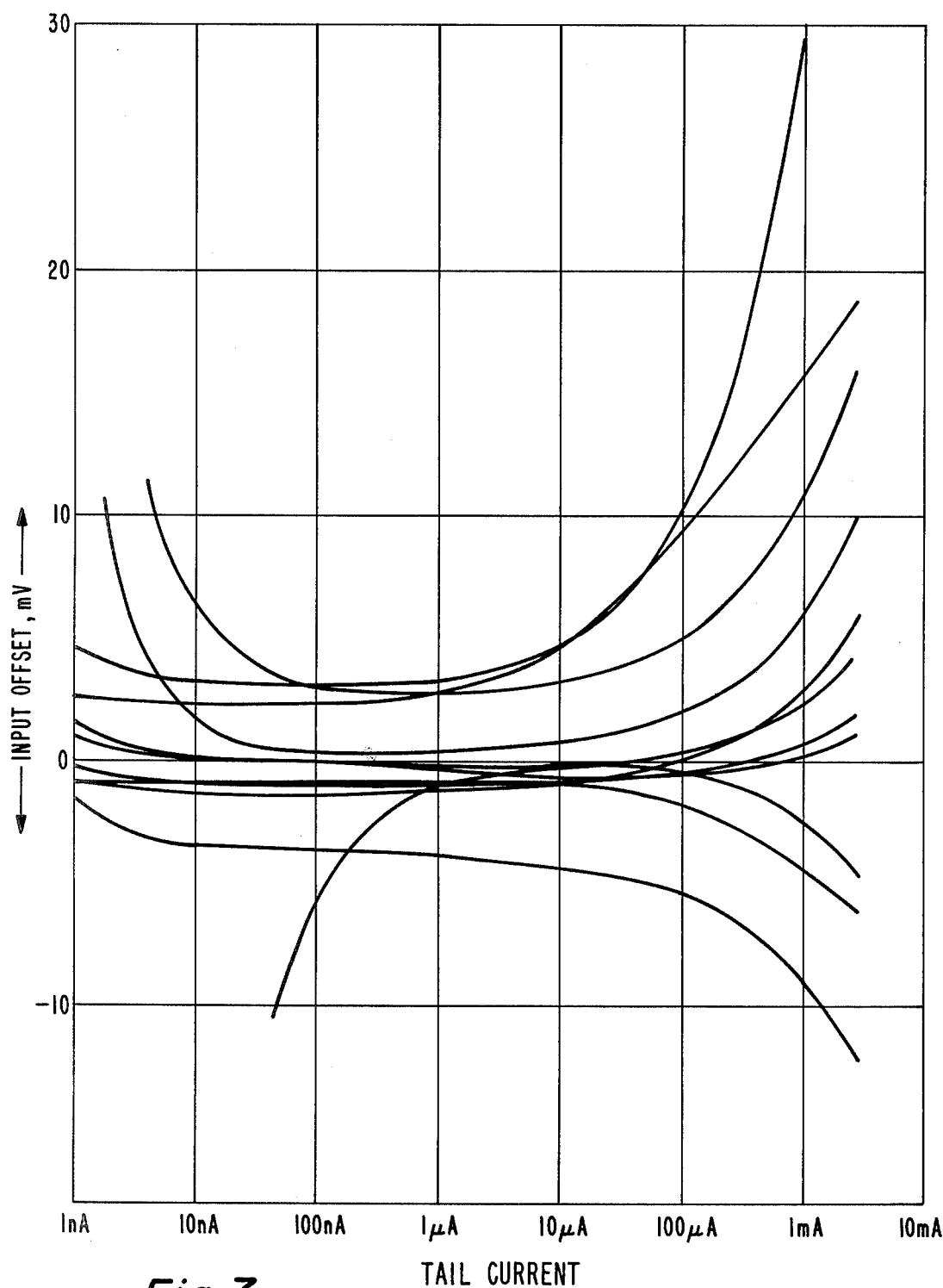
FIG. 7 is a plot of a family of input offset potential error curves versus tail current for typical long-tailed MOSFET pairs showing the reduction of error in the subthreshold region.

FIG. 7 shows the measured input offset potential errors of representative long-tailed MOSFET pairs as a function of the magnitude of their tail currents. The MOSFET's have W/L ratios of 160, channel lengths of 5 micrometers, and are operated with 15 volt $V_{DS}$'s. The pronounced tendency for reduced input offset in the 10 nanoampere to 10 microampere region of tail current, which coincides with the subthreshold region of operation is unmistakable. It is only below 10 nanoamperes or so that surface leakage phenomena begin to assert their deleterious effects tending to increase input offset potential error.

What is claimed is:

1. In a long-tailed pair connection of first and second transistor means having respective input electrodes and having respective common and output electrodes between which an output current flows responsive to an input voltage between its common and input electrodes, the transconductances of which transistor means change more rapidly as a function of their output currents in a range of lower output currents, with means for supplying the entire tail current for said long-tailed pair connection to the interconnected common electrodes of said first and second transistor means, the improvement for the purpose of reducing the input offset error potential which would have to be applied between the input electrodes of said transistor means to maintain the division of the tail current between them in predetermined ratio, wherein said means for supplying the entire tail current for said long-tailed pair consists of:

means for supplying said tail current within said range.

2. In a long-tailed pair connection of first and second conductor-insulator-semiconductor field effect transistors, each having source and drain electrodes with a channel therebetween and having a gate electrode, with means for supplying tne entire tail current for said long-tailed pair connection to the interconnection between the source electrodes of said first and second transistors, the improvement for the purpose of reducing the input offset error potential which would have to be applied between the gate electrodes of said transistors to maintain the division of the tail current between them in the same ratio as their respective channel length-to-width ratios, wherein said means for supplying the entire tail current for said long-tailed pair connection consists of:

means for supplying said tail current in a range where said tail current is small enough to bias said first and second field effect transistors into their subthreshold region wherein weak inversion operation prevails.

3. In a long-tailed pair connection of first and second transistor means having respective input electrodes and having respective common and output electrodes defining the ends of a respective channel through which a respective output current flows responsive to an input voltage between its common and input electrodes, the transconductances of which transistor means change more rapidly as a function of their output currents in a range of lower output currents associated with weak inversion in said channel arising from their input voltages being below threshold value, with means for supplying the entire tail current for said long-tailed pair connection to the interconnected common electrodes of said first and second transistor means, the improvement for the purpose of reducing the input offset error potential which would have to be applied between the input electrodes of said transistor means to maintain the division of the tail current between them in predetermined ratio, wherein said means for supplying the entire tail current for said long-tailed pair consists of:

means for supplying said tail current within said range.

* * * * *